United States Patent [19]

Kashio

[11] 4,034,350
[45] July 5, 1977

[54] INFORMATION-TRANSMITTING APPARATUS

[75] Inventor: Toshio Kashio, Tokyo, Japan

[73] Assignee: Casio Computer Co., Ltd., Tokyo, Japan

[22] Filed: Nov. 14, 1975

[21] Appl. No.: 631,915

[30] Foreign Application Priority Data

Nov. 15, 1974 Japan .......................... 49-131643

[52] U.S. Cl. ............................................ 364/900
[51] Int. Cl.² .................................... G06F 7/34
[58] Field of Search ................ 445/1; 340/172.5

[56] References Cited

UNITED STATES PATENTS

| | | | |
|---|---|---|---|
| 3,344,406 | 9/1967 | Vinal | 340/172.5 |
| 3,430,205 | 2/1969 | Seeber et al. | 340/172.5 |
| 3,444,523 | 5/1969 | Dirks | 340/172.5 |
| 3,451,045 | 6/1969 | Bartlett et al. | 340/172.5 |
| 3,505,653 | 4/1970 | Kautz | 340/172.5 |
| 3,514,760 | 5/1970 | Kautz | 340/172.5 |
| 3,568,156 | 3/1971 | Thompson | 340/172.5 |
| 3,613,086 | 10/1971 | Loizides et al. | 340/172.5 |
| 3,631,405 | 12/1971 | Hoff | 340/172.5 |
| 3,639,519 | 1/1972 | Heath | 340/172.5 |
| 3,646,524 | 2/1972 | Clark et al. | 340/172.5 |
| 3,832,697 | 8/1974 | Kashio | 340/172.5 |
| 3,927,395 | 12/1975 | Kashio | 340/172.5 |
| 3,931,612 | 1/1976 | Stevens et al. | 340/172.5 |

Primary Examiner—Gareth D. Shaw
Assistant Examiner—Jan E. Rhoads
Attorney, Agent, or Firm—Flynn & Frishauf

[57] ABSTRACT

An information-transmitting apparatus for transmitting data records, each comprised of a plurality of data words (column data items), each word comprising a plurality of digits, wherein data words of a data record are compared with the next successive record which is also comprised of a plurality of data words. Each data word of a first record is compared on a digit-by-digit basis with the corresponding data word of a second record, and various digits of the data words of the second record which are identical with those of the corresponding data words of the first record are omitted. Deletion of identical digits of a data word of a second record is continued until a non-coincidence detection signal is produced. Then, the remainder of the digits of the data word of the second record are transmitted. Additionally, special codes which separate the data words and which separate the records are also transmitted.

5 Claims, 7 Drawing Figures

FIG. 1

| Re | CUSTOMER CODE | Cp | CONSECUTIVE NUMBER | Cp | MERCHANDISE CODE | Cp | AMOUNT | Cp | SALES DATE | Re | CU CO |
|---|---|---|---|---|---|---|---|---|---|---|---|
| | (0) | | (1) | | (2) | | (3) | | (4) | | |

FIG. 2

| | Re | | Cp | | Cp | | Cp | | Cp | | Re | |
|---|---|---|---|---|---|---|---|---|---|---|---|---|
| I | Re | 125 | Cp | 1108 | Cp | 25 | Cp | 250,000 | Cp | 3 | Re | 1 |
| II | Re | 125 | Cp | 1109 | Cp | 10 | Cp | 180,000 | Cp | 3 | Re | 1 |
| III | Re | 129 | Cp | 1110 | Cp | 15 | Cp | 150,000 | Cp | 4 | Re | 1 |
| IV | Re | 100 | Cp | 1111 | Cp | 08 | Cp | 500,000 | Cp | 3 | Re | 1 |

FIG. 3

| I | Re | 125 | Cp | 1108 | Cp | 25 | Cp | 250,000 | Cp | 3 | Re | |
| --- | --- | --- | --- | --- | --- | --- | --- | --- | --- | --- | --- | --- |
| II | Re | [9] | Cp | [9] | Cp | 10 | Cp | 180,000 | Cp | 3 | Re | |
| III | Re | [0] | Cp | [10] | Cp | 15 | Cp | 150,000 | Cp | 3 | Re | |
| IV | Re | [0] | Cp | [1] | Cp | 08 | Cp | 500,000 | Cp | 3 | Re | |

FIG. 4

| Re | Cp | 9 | Cp | 10 | Cp | 180,000 | Cp | 3 | Re |
|---|---|---|---|---|---|---|---|---|---|

INFORMATION-TRANSMITTING APPARATUS

BACKGROUND OF THE INVENTION

This invention relates to an information transmitting apparatus which receives a plurality of records of information, each comprised of a plurality of serially arranged data words, as input information and, when transmitting said words to, for example, a separately provided information-processing device, deletes the same digit appearing in the respective compared corresponding arithmetical places of words having the same sequential position in the respective records. Throughout the following description the data words are denoted as "column data".

Where information is processed by, for example, an electronic computer, each record or a unit of a record is divided into a plurality of serially arranged column data (i.e., words) separated from each other by positioning codes. Further, a plurality of said records are serially arranged in the form separated from each other by record positioning codes. This series of records is recorded on a drum, disk or tape to be used as a piece of information being processed. Where a given piece of information being processed consists of sales date, numerical values are indicated in the respective items of each record, such as customer code, consecutive number, merchandise code, sales amount and sales date. Though actual sales data includes a larger number of items, the number thereof is limited as described above for convenience of description. As illustrated in FIG. 1, the column data are separated from each other by the positioning codes Cp. Further, a plurality of records are respectively distinguished from each other by a different positioning code Re. FIG. 2 illustrates a plurality of records showing concrete column data. As is apparent from comparison between the plural records groups I, II, III, IV, the column data representing, for example, "customer code" and "consecutive number" consist of three digits and four digits respectively. Further in many cases, the same digit appears in the respective corresponding arithmetical places of column data arranged in the same sequential position in the respective records. Or the same digit is recorded in some corresponding higher arithmetical places of column data occupying the same sequential position in the respective records. Where, therefore, a series of detail information groups is transmitted to an information-processing device, the same digit obviously must be supplied thereto each time. If, in such case, the same digit appearing in the respective corresponding arithmetical places of column data occupying the same sequential position of the respective records could be deleted in transmitting said column data to an information-processing device, then an amount of information being stored in a memory for arithmetical processing would be decreased, said processing would be carried out more quickly, and in consequence a memory would have only to be provided with a smaller capacity.

This invention has been accomplished from the abovementioned point of view, and is intended to provide an information-transmitting apparatus, which carries out comparison between digits occupying the respective corresponding arithmetical places of column data arranged in the same sequential position of the respective records supplied in succession, and deletes the same digit appearing in the above-mentioned compared corresponding arithmetical places in transmitting the column data to the information-processing device, thus enabling a smaller amount of information to be supplied to the processing device due to the same digit being deleted as described above.

SUMMARY OF THE INVENTION

According to the present invention, an information-transmitting apparatus comprises a source of a series of data records separated from each other by record positioning codes, each record including a plurality of data words separated from each other by word positioning codes, each word including a plurality of digits. Further provided is a memory coupled to the data source for successively storing the words of a series of records one after another, and coincidence detection means coupled to the memory for comparing respective digits of a given word included in a given record stored in the memory with the respective digits occupying corresponding data positions of a word arranged in the same sequential position in another succeeding record. Further provided is information transmitting means coupled to the coincidence detection means for stopping the delivery to an output thereof of those digits of the succeeding record occupying the respective compared positions in words of the succeeding record having the same sequential position in the given record which indicate coincidence as a result of the comparison carried out by the coincidence detection means. The information transmitting means delivers to the output thereof only (i) those of the digits of the succeeding record which do not coincide with corresponding digits of the given record; (ii) any other digits of the word of the succeeding record following said non-coincidence digits regardless of whether or not coincidence is detected for these other digits; and (iii) all of the record positioning and word positioning codes.

The above-mentioned arrangement enables the same digit appearing in the respective compared corresponding arithmetical places of column data arranged in the same sequential position of the respective records to be deleted in transmitting said compared column data to a separately provided information-processing device. Therefore, the information-transmitting apparatus of this invention has the advantages that information can be processed at a higher speed and the amount of information being thus processed can be decreased, enabling a memory fully to serve the purpose with a smaller capacity.

BRIEF DESCRIPTION OF THE DRAWINGS

This invention can be fully understood from the following detailed description when taken in conjunction with the accompanying drawings, in which:

FIG. 1 shows a pattern of heading information consisting of a plurality of heading items;

FIG. 2 presents concrete column data included in four records;

FIG. 3 indicates the arrangement of concrete column data included in the four records of FIG. 2, wherein the same digit is deleted which appears in the respective compared corresponding arithmetical places of column data arranged in the same sequential position in said four records.

FIG. 4 sets forth a schematic pattern of digits recorded in the second record wherein the same digit is deleted which appears in the respective compared corresponding arithmetical places of column data arranged in the same sequential position as those of the first record, and there are only shown different digits of the second record from those of the first record;

FIG. 7 illustrates the manner in which a record is stored in a buffer memory II as shown in FIG. 6.

DETAILED DESCRIPTION

Figure 5:
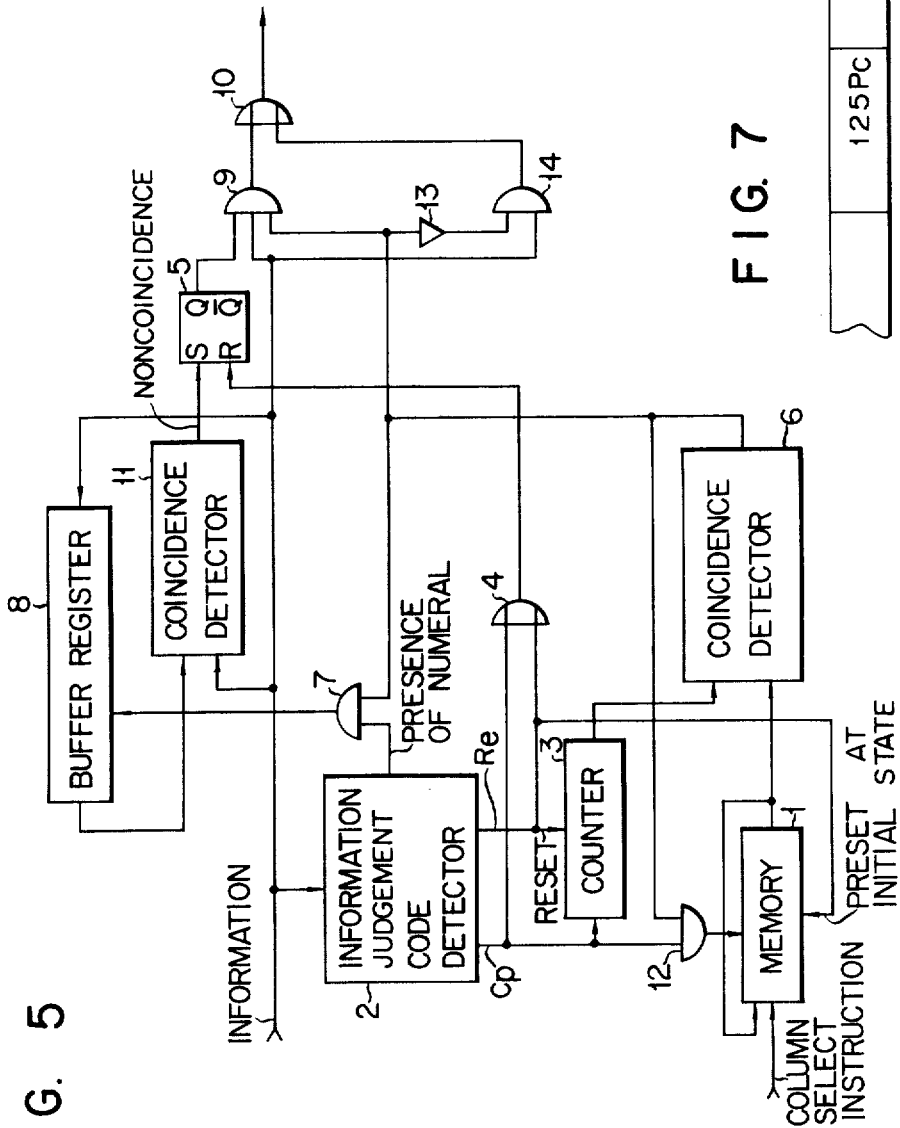
FIG. 5 is a circuit diagram of an information-transmitting apparatus embodying this invention which produces a record wherein the same digit is deleted which appears in the respective compared corresponding arithmetical places of column data arranged in the same sequential position as those of any other records.

The subject information-transmitting apparatus is successively supplied with, for example, the four records or unit record information groups I, II, III, IV of FIG. 2 distinguished from each other by positioning codes Re, each of which consists of, for example, five concrete column data corresponding to the five heading items of FIG. 1 and separated from each other by positioning codes Cp. As is apparent from FIG. 2, some of the heading items, for example, the customer code represented by a heading item number (0) indicates a 3-digit numeral and the consecutive number denoted by a heading item number (1) shows a 4-digit numeral, and some of the respective corresponding arithmetical places of a column data representing the customer code (0) and a column data constituting the consecutive number (1) indicate the same group of digits. Upon receipt of a column select instruction, therefore, the memory 1 of FIG. 5 is successively stored with the numbers (0), (1) of the heading items, that is, the customer code and consecutive number such that the column data constituting said heading items (0), (1) can be later specified for deletion. When the memory 1 is stored with a record -positioning code Re ahead of an item numeral "125" corresponding to the foremost heading item (0), that is, the customer code included in the first one of a series of said records, which are later successively stored in the memory 1, then said positioning code Re, after being read out therefrom, is detected by an information judgement code detector 2. At this time, the memory 1 is preset at its original condition. An output signal from said code detector 2 showing the detected positioning code Re resets a counter 3 and also a flip-flop circuit 5 through an OR circuit 4, the reset counter 3 generates an output of zero. When preset by an output signal showing the detected positioning code Re, the memory 1 already stored with the customer code (0) generates an output showing said heading item number (0).

"0" outputs from the counter 3 and memory 1 are supplied to a coincidence detector 6, which in turn sends forth an output showing coincidence between both zero outputs. Said coincidence output is conducted to one of the gates of an AND circuit 7. When the memory 1 is supplied with the item numeral "125" of the foremost customer code (0) in succession to the record-positioning code Re, then the information judgement code detector 2 detects the presence of a numeral. A detection output is transmitted to the other gate of the AND circuit 7. As the result, a shift instruction is supplied through the AND circuit 7 to a buffer memory 8, which in turn is successively stored with the three digits "125" of the foremost customer code (0).

When the record-positioning code Re is detected, the flip-flop circuit 5 remains reset by said positioning code Re, and is not set, until it receives an output signal from a coincidence detector 11. Therefore, the gates of an AND circuit 9 are not opened, preventing a series of rcords from being transmitted to an information-processing device through the AND circuit 9 and OR circuit 10.

When the item numeral "125" stored in the buffer memory 8 by a shift instruction delivered from the ANd circuit 7 upon receipt of the record-positioning code Re represents the customer code (0) of the first one of a series of records, then said buffer memory 8 is not stored with any other information. While said item numeral 125 is supplied not only to the buffer memory 8 but also to the coincidence detector 11, the buffer memory 8 does not give forth any output signal. Accordingly, the coincidence detector 11 produces an output signal of noncoincidence to set the flip-flop circuit 5, which in turn sends forth a set output to one of the gates of the AND circuit 9. At this time, an output signal of coincidence corresponding to the foremost customer code (0) which is delivered from the coincidence detector 6 is conducted to another gate of the AND circuit 9 to open it. As a result, the item numeral 125 is drawn out in succession to the record-positioning code Re through the OR circuit 10 to be later processed. The data-positioning code Cp in succession to the item numeral 125 is detected by the information judgement code detector 2. An output signal showing said detected positioning code Cp is supplied as a reset signal to the flip-flop circuit 5 through the OR circuit 4, preventing any input information from being read out through the AND circuit 9 and OR circuit 10. The column data-positioning code Cp is also supplied as an advance instruction to the counter 3, which in turn is advanced in counting from the reset state of 0 to a count of 1. This output signal showing a count of 1 is delivered to the coincidence circuit 6. Said column data-positioning code Cp is directly supplied to one of the gates of an AND circuit 12, which in turn is opened, because the other gate thereof is supplied with the aforesaid output signal of the coincidence detector 6 showing coincidence between the 0 output signals from the counter 3 and memory 1. As a result, the memory 1 in which heading item numbers being compared are specified is supplied with a shift instruction, and consequently sends forth to the coincidence detector 6 an column data-specifying output signal corresponding to the consecutive number (1). When supplied with an output signal showing a count of 1 from the counter 3, and also with an output signal specifying the consecutive number (1) from the memory 1, then the coincidence detector 6 generates a coincidence output signal of 1, which in turn is conducted to one of the gates of the AND circuits 7, 9, 12 respectively.

The column data "1108" of the second heading item in succession to the preceding column data-positioning code Cp is detected by the information judgement code detector 2. A detection output signal from said detector 2 proving the presence of the aforesaid numeral 1108 opens the AND circuit 7, which allows a shift instruction to be delivered to the buffer memory 8. The column data 1108 is stored in the buffer memory 8 in succession to the column data 125.

The buffer memory 8 has a sufficient capacity to store a maximum number of digits among at least those of the column data included in the respective records which should be compared. Even when, therefore, stored with the column data 1108, the buffer memory 8 does not yet produce any output. The coincidence detector 11 does not generate an output showing coincidence between any of the digits of column data of the preceding detail information group in which said column data 1108 is included and any of the digits of those column data of the succeeding record which are arranged in the corresponding sequential positions in said preceding record, but gives forth an output of noncoincidence. This output of noncoincidence sets the flip-flop circuit 5, a set output from which is supplied as a gating signal to the AND circuit 9 together with an output of coincidence from the coincidence detector 6 which specifies the second heading item (1), that is, the consecutive number for comparison. As a result, the column data 1108 is read out in succession to the column data positioning code Cp as information being processed through the AND circuit 9 and OR circuit 10. When the information judgement code detector 2 detects a column data-positioning code Cp preceding the column data "25" of the third heading item (2), that is, the merchandise code in succession to the column data 1108, then a detection output from said detector 2 resets the flip-flop circuit 5 as previously described through the OR circuit 4, temporarily preventing column data following the above-mentioned column data 1108 from being sent forth from the AND circuit 9. Under this condition, the column data positioning code Cp following said column data 1108 is delivered as an advance instruction to the counter 3 and also as a shift instruction to the memory 1 through the AND circuit 12. At this time, the counter 3 is advanced from a count of 1 to a count of 2 and generates an advance output. Even when, therefore, a shift instruction is supplied to the memory 1 which is not stored with an instruction for specifying any column data following the column data 25 of the merchandise code (2), the coincidence detector 6 does not generate a coincidence output. An output from an inverter 13 connected to the output terminal of the coincidence detector 6 is transmitted to one of the gates of an AND circuit 14. Since the other gate of said AND circuit 14 is already supplied with all the column data of the first record the column data which were not specified for comparison, such as the column data 25 of the third heading item (2), that is, the merchandise code and the column data "250,000" and "3" of the following heading items (3), (4), namely, the sales amount and sales date are later read out to the information-processing device in succession to the aforesaid column data 1108. All the serially arranged column data of the first record read out for processing collectively present a pattern indicated in I of FIG. 3 as like as I of FIG. 2. Since at this time, the coincidence detector 6 does not produce any output, the AND circuit 7 is not supplied with an input. Nor the buffer memory 8 is supplied with a shift instruction. Among the column data of the first record, therefore, only the column data 125 and 1108 of the first and second heading items (0), (1), that is, the customer code and consecutive number which are already specified for comparison remain stored in the buffer memory 8.

When the second record shown in II of FIG. 2 is stored in the memory 1 in succession to the corresponding positioning code Re, then this positioning code Re is detected by the information judgement code detector 2 which generates a detection output which resets the counter 3 and presets the memory 1 at its original state. Zero outputs from the counter 3 and memory 1 cause the coincidence detector 6 to give forth a coincidence output, which in turn is supplied as a gating signal to the AND circuits 7, 9. The first digit 1 of the foremost column data 125 of the second record is read out to the coincidence detector 11 and is also detected by the information judgement code detector 2. A detection output from said detector 2 opens one of the gates of the AND circuit 7 and is transmitted as a shift instruction to the buffer memory 8. As a result, the first digit 1 of the foremost column data 125 of the second record group already stored in the buffer memory 8 is delivered to the coincidence 11, which detects coincidence between the first digit 1 of the foremost column data 125 of the first record and the first digit 1 of the corresponding foremost column data 125 of the second record. However, the coincidence detector 11 which sets the flip-flop circuit 5 only when detecting noncoincidence does not generate any output when detecting coincidence between the above-mentioned first digit 1 of both records. Since, at this time, the flip-flop circuit 5 does not produce an output, the first digit 1 of the foremost column data 125 of the second record is prevented from being read out to the separately provided information processing device through the AND circuit 9 and OR circuit 10. Since coincidence is similarly established between the second and third digits 2 and 5 of both records, the coincidence detector 11 does not send forth an output. Further, the coincidence detector 6 generates an output showing coincidence between the digits of the foremost column data 125 of both records, and in consequence the inverter 13 does not produce an output. Thus, the column data 125 of the foremost heading item (0), that is, the customer code of the second record is not delivered either from the AND circuit 9 or AND circuit 14, but is deleted in transmitting said second record to the information-processing device. When the memory 1 is stored with a column data-positioning code Cp preceding the column data "1109" of the second heading item (1), that is, the consecutive number of the second record, then said positioning code Cp, after being read out from the memory 1, is detected by the information judgement code detector 2, causing the counter 3 to be advanced in counting, and also the memory 1 to have its contents shifted. As a result, the coincidence detector 6 sends forth an output showing coincidence between outputs from the counter 3 and memory 1, which opens the AND circuit 7. The other gate of the AND circuit 7 is supplied with the first digit 1 of the column data 1109 as an indication of the presence of a numeral in the memory 1. An output from the AND circuit 7 is supplied as a shift instruction to the buffer memory 8. Comparison is made by the coincidence detector 11 between the respective digits of the column data 1108 of the second heading item (1), that is, the consecutive number of the first record group and the digits occupying the respective corresponding arithmetical places of the column data 1109 of the second heading item (1), that is, the consecutive number of the second record. Since the first three digits of both column data 1108 and 1109 are respectively the same, the flip-flop circuit 5 is not set, preventing the first three digits of the second record from being transmitted to the separately provided information-processing device.

When the fourth digit 9 of the second column data 1109 of the second record is recieved, the coincidence detector 11 issues an output, because the fourth digit 8 of the second column data 1108 of the first record does not coincide with the fourth digit 9 of the second column data 1109 of the second record, thereby setting the flip-flop circuit 5. A set output from said flip-flop circuit 5 is supplied as a gating signal to the AND circuit 9. As a result, the digit 9 is transmitted to the information-processing device immediately after the column data positioning code Cp. Since no column designation is made in the memory 1 with respect to the item numeral "10" of the third heading item (2), that is, the merchandise code of the second record which the operator judges need not be subjected to comparison, the coincidence detector 6 does not give forth an output, and in consequence the AND circuit 9 is not supplied with a gate input. Absence of an output from the coincidence detector 6 causes the inverter 13 to generate an output which in turn is supplied as a gating signal to the AND circuit 14. Therefore, the above-mentioned column data 10 is transmitted to the information-processing device through the AND circuit 14 and OR circuit 10. The column data 180,000 and 3 of the fourth and fifth heading items, that is, the sales amount and sales date of the second record are transmitted to the information-processing device through the above-mentioned operation in the form preceded by the corresponding positioning code Cp. Eventually, the second record is conducted to the information-processing device in the partially deleted form as shown in FIG. 4 with a positioning code Re disposed immediately behind the second record to distinguish it from the third record. The third and fourth records are delivered to the information-processing device in the partially deleted form as illustrated in FIG. 3 in which the digits enclosed in the dotted lines are omitted. As mentioned above, the information-transmitting apparatus of this invention enables a series of records to be transmitted to the information-processing device in the form wherein the same digit is deleted which appears in the respective corresponding arithmetical places of column data arranged in the same sequential position of the respective records. Therefore, processing can be effected at a higher speed and the amount of information being stored in a memory for subsequent processing is decreased, thereby enabling a memory to be used which has a smaller capacity than can be used in the prior art.

Figure 6:
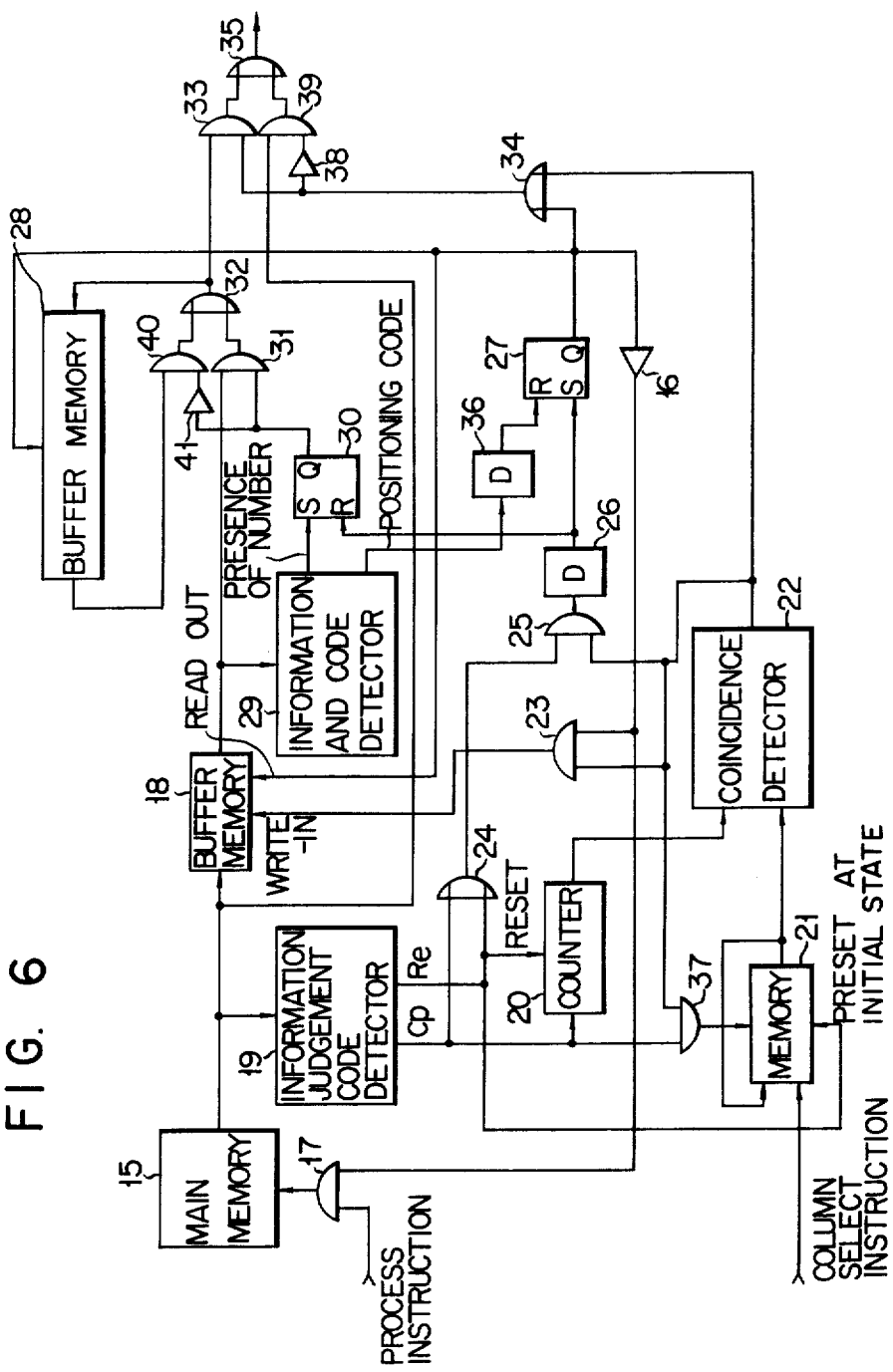
FIG. 6 presents the arrangement of a circuit for reading out in the fully restored form the column data which were previously stored in a memory in the fully or partially deleted form.

There will now be described by reference to FIG. 6 the operation of the embodiment of this invention which can restore, as occasion demands, the partially deleted form in which a series of records were previously stored in a memory back to the original nondeleted form.

Now let it be assumed that a main memory 15 has already received from the OR circuit 10 of FIG. 5 a comprehensive piece of information being processed which comprises a series of a nondeleted records and a plurality of partially deleted records. Namely, the main memory 15 is stored first with the first nondeleted record I of FIG. 3 and then with the second, third and fourth records II, III, IV in the partially deleted form wherein the digits enclosed in dotted lines are omitted. When a processing instruction is supplied to one of the gates of an AND circuit 17, the other gate of which is connected to an inverter 16, an output from said AND circuit 17 causes the above-mentioned series of records to be read out from the main memory 15. The information thus read out is again written in a buffer memory-I 18 upon receipt of a write-in instruction. The buffer memory-I 18 is chosen to have a sufficient capacity to store a maximum number of digits (with the positioning codes Cp, Re regarded as digits) amon the respective column data of the plural records, for example, screen digits in the case of the present embodiment. The positioning code Re of the first record I detected by the information judgement code detector 19 resets a counter 20 and also passes through an AND circuit 39 and OR circuit 35 to preset the memory 21 to its original condition in which fully or partially deleted column data are specified for comparison. Now the memory 21 is assumed selectively to specify for comparison the first and second heading items (0), (1), that is, the customer code and consecutive number as in the embodiment of FIG. 5. Outputs from the counter 20 and memory 21 are supplied to the coincidence detector 22. When coincidence is established between said outputs, the coincidence detector 22 generates a coincidence output, which in turn is conducted through an AND circuit 23 to the buffer memory-I 18 as an instruction to write information delivered from the main memory 15 in said buffer memory-I 18. At this time, the AND circuit 39 is closed upon recepit of an output from the coincidence detector 22 through an OR circuit 34 and inverter 38. As a result, the positioning code Re of the first record and the succeeding item numeral 125 of the first heading item (0), that is, the customer code are written in the buffer memory-I 18. An output showing the positioning code Re of the first record which was detected by the information judgement code detector 19 is supplied to one of the gates of an AND circuit 25 through an OR circuit 24. The other gate of the AND circuit 25 is supplied with a coincidence output from the coincidence detector 22. An output from the AND circuit 25 is supplied as a set input to a flip-flop circuit 27 through a delay circuit 26. One of the gates of the AND circuit 25 is supplied with an output from the coincidence detector 22, and both gates of said AND circuit 25 are opened upon receipt of the positioning code Cp following the first item numeral 125. Said positioning code Cp is stored in the buffer memory-I 18 after the first column data 125 of the customer code (0) whose digits are to be deleted is stored therein. When read out from the buffer memory-I 18, said positioning code Cp is detected by the information judgement code detector 19, an output from which is supplied as a gating signal to the AND circuit 25 through the OR circuit 24. An output from the AND circuit 25 is conducted to the delay circuit 26. After the buffer memory-I 18 is stored with the aforesaid positioning code Cp following the first column data 125, the delay circuit 26 generates an output, which in turn sets the flip-flop circuit 27. Detection of the abovementioned positioning code Cp causes the counter 20 to be advanced to a count of 1. A signal showing the detected positioning code Cp and an output from the coincidence detector 22 cooperate to open the gates of the AND circuit 37 and also cause shifting to take place in the memory 21. As a result, the memory 21 produces an output of 1, which is used to determine whether the second column data should be partially deleted. A set output from the flip-flop circuit 27 prevents the inverter 16 from generating a write-in instruction, and consequently the second column data following the information "125 CP" from being stored in the buffer memory-I 18. An output delivered from the flip-flop circuit 27 at this time is supplied as a readout instruction to the first buffer memory-I 18, and also as a shift instruction to a second memory-II 28 which is stored with the nondeleted column data specified for subsequent partial deletion and read out from the first buffer memory-I 18. While the first buffer memory-I 18 only has a sufficient capacity to store a maxinumber of digits (with positioning codes Re, Cp regarded as digits) among the respective column data of a plurality of detail information groups, the second buffer memory-II 28 as large a capacity as an integral multiple of that of the first buffer memory-I 18. When information 125 Cp is read out from the first buffer memory-I 18, the column data 125 is detected by an information and code detector 29, a detection output from which sets a flip-flop circuit 30. An output from this flip-flop circuit 30 is conducted to one of the gates of an AND circuit 31, the other gate of which is supplied with the information 125 Cp. As a result, said AND circuit 31 gives forth an output which in turn is stored in the second buffer memory-II 28 through an OR circuit 32. The column data 125 sent forth from the OR circuit 32 is carried to one of the gates of an AND circuit 33, the other gate of which is supplied with an output from the flip-flop circuit 27 through an OR circuit 34. Accordingly, the AND circuit 33 produces an output, which in turn is transmitted to the information-processing device through an OR circuit 35. A detection output from the information and code detector 29 which denotes the positioning code Cp read out from the first buffer memory-I 18 is supplied to the reset terminal of the flip-flop circuit 27 through a delay circuit 36, preventing a shift instruction from being supplied to the second buffer memory-II 28. Therefore, no shifting takes place therein, with the column data 125 still stored. When the flip-flop circuit 27 is reset, the inverter 16 again produces an output which is delivered to one of the gates of the AND circuit 23. At this time the AND circuit 17 is opened, causing the succeeding information "1108 Cp" to be read out from the main memory 15. Since the coincidence detector 22 generates an output showing coincidence between outputs from the counter 20 and memory 21, the AND circuit 23 remains opened. Said coincidence output from the coincidence detector 22 is supplied as a write-in instruction to the first buffer memory-I 18, causing the information 1108 Cp to be stored in the first buffer memory-I 18. When the column data-positioning code Cp is detected, a set output from the flip-flop circuit 27 is supplied to the inverter 16, preventing the information 1108 Cp from being stored in the first buffer memory-I 18 for the second time. Detection of the above-mentioned code Cp causes the counter 20 to be advanced in counting and also shifting to take place in the memory 21 through the AND circuit 37. A set output from the flip-flop circuit 27 is supplied as a readout instruction to the first buffer memory-I 18. The information 1108 Cp read out from said buffer memory-I 18 is stored in succession to the information 125 Cp through the AND circuit 31 and OR circuit 32 in the second buffer memory-II 28 which is already supplied with the aforesaid set output as a shift instruction. Thereafter, like the preceding information 125 Cp, the following information 1108 Cp is transmitted to the information-processing device through the AND circuit 3 and OR circuit 35. A detection output from the information and code detector 29 which denotes the column data positioning code Cp passes through the delay circuit 36, interrupting the supply of a shift instruction from the flip-flop circuit 27 to the second buffer memory-II 28. As a result, two equal half sections of the second buffer memory-II 28 representing its capacity, for example, two-fold larger than that of the first buffer memory-I 18 are successively stored, as illustrated in FIG. 7, with two pieces of column data information 125 Cp and 1108 Cp in such a manner that said two pieces of column data information are stored in the above-mentioned two equal half sections respectively at such locations as admit of the provision of a surplus storing space relative to the specified length of each equal half section of the second buffer memory-II 28 or in some cases cause the entire storing space to be filled with digits and that the last digit (with the positioning code Cp regarded as a digit) of said two pieces of column data information is disposed at the end location of each equal half section of the second buffer memory-II 28. When the information judgement code detector 19 gives forth an output showing a detected positioning code Cp, then the counter 20 is further advanced from a count of 1. At this time the memory 21 is still stored only with the column data of the first and second heating items, that is, the customer code and consecutive number. Therefore, even when a shift instruction is supplied to the memory 21 through the AND circuit 37, a signal specifying any of the column data of the third and following heading items is not read out from the memory 21. Accordingly, the third column data information "25 Cp" is not written in the first buffer memory-I 18, but is conducted as a gating signal to the AND circuit 39 together with an output from the inverter 38 connected to the OR circuit 34. An outpt from the AND circuit 39 which denotes a piece of column data information 25 Cp is preceded by "Re", 125 Cp and 1108 Cp already conducted through the OR circuit 35 and followed by another piece of column data information "250,000 Cp 3". All these pieces of column data information are transmitted to the information-processing device. Thereafter, the positioning code Re of the second record which is now rearranged in the partially deleted form illustrated in FIG. 4 is read out from the main memory 15. When detecting said positioning code Re, the information judgement code detector 19 produces a detection output, which in turn resets the counter 20 and causes the memory 21 to be preset at its original condition.

In the same manner as mentioned above, the coincidence detector 22 generates an output denoting coincidence between 0 outputs from the counter 20 and memory 1. As a result, a write-in instruction is supplied to the first buffer memory-I 18 through the AND circuit 23 and also as a gating signal to one of the gates of the AND circuit 25. In this case, the record-positioning code Re and the positioning code Cp of the second column data of the second record are read out in succession as shown in FIG. 4. The other gate of the AND circuit 25 is supplied with a signal showing the detected positioning code Cp through the OR circuit 24. When said positioning code Cp is stored in the first buffer memory-I 18, the AND circuit 25 generates an output which in turn is sent forth as a shift instruction to the second buffer memory-II 28 through the delay circuit 26 and flip-flop circuit 27. A set output from the flip-flop circuit 27 when set by a delayed output from the delay circuit 26 is supplied as a readout instruction to the first buffer memory-I 18 to read out the positioning code Cp therefrom. The positioning code Cp thus read out is detected by the information judgement code detector 29, a detection output from which is delayed by the delay circuit 36. A shift instruction continues to be supplied to the second buffer memory-II 28 until the flip-flop circuit 27 is reset by a delayed output from the delay circuit 36. Column data information "Re 125" read out from the second buffer memory-II 28 is sent forth to one of the gates of the AND circuit 40, the other gate of which is supplied with an output from an inverter 41 connected to the output terminal of the flip-flop circuit 30. As a result, the AND circuit 40 produces an output, which in turn is conducted to one of the gates of the AND circuit 33 through the OR circuit 32. The other gate of the AND circuit 33 is supplied with a set output from the flip-flop circuit 27 through the OR circuit 34. Thus an output from the AND circuit 33 which denotes column data information 125 Cp is transmitted to the information-processing device through the OR circuit 35. When the column data-positioning code Cp delayed by the delay circuit 36 is supplied to the reset input terminal of the flip-flop circuit 27, the inverter 16 again issues an output to read out the digit 9 and the succeeding column data-positioning code Cp from the main memory 15. These pieces of information thus read out, that is, 9 and Cp are stored in the first buffer memory-1 18 upon receipt of a write-in instruction from the AND circuit 23 and later read out from said buffer memory-I 18 upon receipt of a set output from the flip-flop circuit 27 and finally supplied to one of the gates of the AND circuit 31. A shift instruction continues to be supplied to the second buffer memory-II 28 to read out therefrom item information 1108 Cp following the preceding column data information 125 Cp already read out from said second buffer memory-II 28, until the supply of a shift instruction from the flip-flop circuit 27 is stopped by the positioning code Cp read out from the first buffer memory-I 18. When the pieces of information 9, and Cp are read out from the buffer memory-I 18, a detection output from the information and code detector 29 which denotes the digit 9 sets the flip-flop circuit 30. A set output from the flip-flop circuit 30 prevents the inverter 41 from producing an output, and also the digit 8 following Cp, "110" already read out from the second buffer memory-II 28 from being read from the AND circuit 40. An output from the flip-flop circuit 30 is delivered to one of the gates of the AND circuit 31. The digit 9 which was read out from the first buffer memory-I 18 follows the previously read out 110 in place of 8 whose readout was prevented by the AND circuit 40.

Thus, a piece of column data information 1108 Cp is transmitted to the information-processing device through the AND circuit 31, OR circuit 32, AND circuit 33 and OR circuit 35 in turn. The foregoing description applies to other column data. Namely, those column data which are first stored in the main memory 15 in the fully or partially deleted form are read out in the original nondeleted form and transmitted to the information-processing device.

What is claimed is:

1. An information-transmitting apparatus comprising:

a source of a series of data records separated from each other by record positioning codes, each record including a plurality of data words separated from each other by word positioning codes, each word including a plurality of digits;

first memory means coupled to said source for successively storing the words of a series of records one after another;

coincidence detection means coupled to said first memory means for comparing respective digits of a given word included in a given record stored in said first memory means with the respective digits occupying corresponding data positions of a word arranged in the same sequential position in another succeeding record; and control means coupled to said coincidence detection means for controlling the data transmission, said control means having an output and including means for stopping the delivery to said output of those of said digits of said succeeding record occupying the respective compared positions in words of said succeeding record having the same sequential position in the given record which indicate coincidence as the result of the comparison carried out by said coincidence detection means, and for delivering to said output only:

i. those of the digits of said succeeding record which do not coincide with corresponding digits of said given record;

ii. any other digits of said word of said succeeding record following said noncoincidence digits regardless of whether or not coincidence is detected as the result of comparison; and iii. all of said record positioning and word positioning codes.

2. The information-transmitting apparatus according to claim 1, further comprising control means coupled to said source and including a second memory means for specifying those column data of a series of records which are to be compared by said coincidence detection means when read out from said first memory means, thereby unconditionally allowing nonspecified column data to be transmitted to the information-processing device.

3. The information-transmitting apparatus according to claim 1, wherein corresponding words of said plurality of data records are arranged in columns, each of said words comprising a column data item.

4. The information-transmitting apparatus according to claim 1, wherein said coincidence detection means is coupled to the output of said first memory for receiving digits from said first memory one-by-one, and is coupled to said data source for receiving the digits of records from said data source one after another to thereby compare respective digits of data records for coincidence.

5. The information-transmitting apparatus according to claim 1 further comprising a code detector coupled to said source for detecting said record positioning and said word positioning codes and for generating respective outputs responsive to said codes; and switching means coupled to the output of said coincidence detection means and being switchable responsive to an output of said code detector.

* * * * *